United States Patent
Liou et al.

(10) Patent No.: US 12,087,692 B2
(45) Date of Patent: Sep. 10, 2024

(54) HARDENED INTERLAYER DIELECTRIC LAYER

(71) Applicant: Taiwan Semiconductor Manufacturing Co., Ltd., Hsinchu (TW)

(72) Inventors: Joung-Wei Liou, Hsinchu (TW); Greg Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 109 days.

(21) Appl. No.: 15/940,145

(22) Filed: Mar. 29, 2018

(65) Prior Publication Data

US 2019/0096820 A1    Mar. 28, 2019

Related U.S. Application Data

(60) Provisional application No. 62/564,460, filed on Sep. 28, 2017.

(51) Int. Cl.
| | | |
|---|---|---|
| *H01L 23/532* | (2006.01) | |
| *H01L 21/02* | (2006.01) | |
| *H01L 21/768* | (2006.01) | |
| *H01L 23/528* | (2006.01) | |

(52) U.S. Cl.
CPC .. *H01L 23/53295* (2013.01); *H01L 21/76813* (2013.01); *H01L 21/76826* (2013.01); *H01L 21/76843* (2013.01); *H01L 23/53209* (2013.01)

(58) Field of Classification Search
CPC ......... H01L 23/53295; H01L 21/76813; H01L 21/76843; H01L 21/76877; H01L 21/76807; H01L 21/76804; H01L 21/76832; H01L 21/76802

See application file for complete search history.

(56) References Cited

U.S. PATENT DOCUMENTS

| | | | |
|---|---|---|---|
| 7,968,451 B2 | 6/2011 | Ko et al. | |
| RE42,514 E | 7/2011 | Tsai et al. | |
| 8,173,537 B1 | 5/2012 | Chattopadhyay et al. | |
| 2004/0087133 A1 | 5/2004 | Kumar | |
| 2004/0155340 A1* | 8/2004 | Owada ............... | H01L 21/02216 257/E23.161 |
| 2005/0124151 A1* | 6/2005 | Cheng ............... | H01L 21/31633 438/783 |
| 2007/0205516 A1* | 9/2007 | Chen ..................... | H01L 21/022 257/E21.27 |
| 2010/0227470 A1* | 9/2010 | Nagano ............. | H01L 21/76814 257/E21.585 |

(Continued)

OTHER PUBLICATIONS

Hysitron, Inc, Scientek Corporation, World Leaders in Nanomechanical Testing, PowerPoint, 108 pages.

*Primary Examiner* — Antonio B Crite
(74) *Attorney, Agent, or Firm* — Sterne, Kessler, Goldstein & Fox P.L.L.C.

(57) ABSTRACT

The present disclosure relates to a semiconductor device and a manufacturing method thereof, and more particularly to an interlayer dielectric (ILD) layer in a semiconductor device. In one example, the ILD layer is over a substrate and includes a dielectric with a dielectric constant of less than about 3.3 and a hardness of at least about 3 GPa. The semiconductor device also includes an interconnect formed in the ILD layer.

20 Claims, 5 Drawing Sheets

(56) References Cited

U.S. PATENT DOCUMENTS

| | | | |
|---|---|---|---|
| 2011/0206857 A1* | 8/2011 | Yim | H01L 21/7681 |
| | | | 427/493 |
| 2012/0074535 A1 | 3/2012 | Huang et al. | |
| 2012/0313256 A1* | 12/2012 | Lu | H01L 21/7681 |
| | | | 257/E21.586 |
| 2015/0027189 A1 | 1/2015 | Lee et al. | |
| 2015/0179579 A1* | 6/2015 | Jezewski | H01L 21/76846 |
| | | | 438/644 |
| 2015/0228584 A1* | 8/2015 | Huang | H01L 25/50 |
| | | | 257/774 |
| 2015/0255330 A1* | 9/2015 | Lee | H01J 37/32899 |
| | | | 438/653 |
| 2016/0013050 A1* | 1/2016 | Pfutzner | H01L 21/02318 |
| | | | 257/773 |
| 2016/0171992 A1* | 6/2016 | Zhang | G11B 5/10 |
| | | | 360/235.4 |
| 2017/0040212 A1* | 2/2017 | Omori | C23C 14/34 |
| 2017/0125353 A1* | 5/2017 | Chen | H01L 23/5329 |
| 2018/0122632 A1* | 5/2018 | Vrtis | H01L 21/02216 |
| 2019/0096820 A1 | 3/2019 | Liou et al. | |
| 2019/0363048 A1* | 11/2019 | Zhao | H01L 23/5226 |
| 2022/0293417 A1* | 9/2022 | Vrtis | H01L 21/02216 |

* cited by examiner

HARDENED INTERLAYER DIELECTRIC LAYER

CROSS-REFERENCE TO RELATED APPLICATION

This application claims the benefit of U.S. Provisional Patent Application No. 62/564,460, titled "Hardened Interlayer Dielectric Layer," which was filed on Sep. 28, 2017 and is incorporated herein by reference in its entirety.

BACKGROUND

Semiconductor fabrication technologies can use dielectric materials as insulating layers between circuits and components of circuits (e.g., integrated circuits). For example, dielectric materials can be used between interconnection layers of a multilayer interconnect structure of a semiconductor device. These dielectric materials can be referred to as "interlayer dielectrics" (ILDs), also known as "inter-metal dielectrics (IMDs)." As dimensions decrease in semiconductor device components, the requirement to isolate adjacent features from one another becomes more critical, and more difficult. The design of ILDs is thus critical to meet these challenges.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Semiconductor chip fabrication process can be divided into three "modules," in which each module may include all or some of the following operations: patterning (e.g., photolithography and etching), implantation, metal and dielectric material deposition, wet or dry cleaning, and planarization (e.g., etch-back process or chemical mechanical planarization). The three modules can be categorized as front end of the line (FEOL), middle of the line (MOL)/middle end of the line (MEOL), and back end of the line (BEOL).

In the FEOL, active devices, such as field effect transistors (FETs), are formed. For example, FEOL includes the formation of source/drain terminals, a gate stack, and spacers on sides of the gate stack. The source/drain terminals can be doped substrate regions formed with an implantation process after the gate stack formation. The gate stack can include a metal gate electrode, which can include two or more metal layers. The gate dielectric can include a high dielectric constant (high-k) material (e.g., greater than 3.9, which is the dielectric constant of silicon dioxide ($SiO_2$)). Metals in the gate electrode can set a work function of the gate, in which the work function can be different between a p-type FET and an n-type FET. The gate dielectric can provide electrical isolation between the metal gate electrode and a channel formed between the source and the drain terminals when the FET is in operation.

In the MOL, low level interconnects (contacts) are formed and can include two layers of contacts on top of each other. The MOL interconnects can have smaller critical dimensions (CDs; e.g., line width) and can be spaced closer together compared to their BEOL counterparts. A purpose of the MOL contact layers is to electrically connect the FET terminals (e.g., the source/drain and gate electrodes) to higher-level interconnects in BEOL. A first layer of contacts in MOL, known as "trench silicide (TS)," are formed over the source and drain terminals on either side of a gate stack. In the TS configuration, the silicide is formed in the trench after trench formation. The silicide can lower a resistance between source/drain regions and the metal contacts. The gate stack and the first layer of contacts are considered to be on the same "interconnect level." The second layer of contacts can be formed over the gate electrode and TS. MOL contacts can be embedded in a dielectric material, or a dielectric stack of materials, which ensures their electrical isolation.

In the BEOL, an ILD layer is deposited over the MOL contacts. As disclosed herein, an "ILD layer" is also known as an "IMD layer." The formation of high level interconnects in the BEOL can include patterning a hard mask (HM) layer and subsequently etching through the HM layer to form holes and trenches in the ILD layer. The ILD layer can be manufactured using a low-k material. Low-k materials can have a dielectric constant below 3.9, which is the dielectric constant of silicon dioxide. Low-k materials in the BEOL include, for example, fluorine-doped silicon dioxide, carbon-doped silicon dioxide, or porous silicon dioxide. These low-k materials can reduce unwanted parasitic capacitances and minimize resistance-capacitance (RC) delays in the FET. BEOL interconnects can include two types of conductive lines: vertical interconnect access lines (vias) and lateral lines (lines). The vias can run through the ILD layer in a vertical direction and create electrical connections to layers above or below the ILD layer. Lines can be laid in the lateral direction within the ILD layer to connect a variety of components within the same ILD layer. The BEOL can include multiple layers (e.g., up to 9 or more layers) of vias and lines with increasing CDs (e.g., line width) and interconnect pitch. Each layer can align to a previous layer to ensure proper via and line connectivity.

Miniaturization of semiconductor devices (e.g., dimensional shrinkage in BEOL, such as the reduction of interconnect pitch) can decrease mechanical strength of low-k ILD layers. As a result, dielectric layer bending may occur during interconnect formation due to the weak mechanical strength of the low-k ILD layers. For example, stress introduced by the deposition of a barrier layer may compromise the structure of the low-k ILD layer surrounding a via such that the structure may no longer support the via. Dielectric layer bending can decrease the CDs and cause poor metal gap-fill, thereby reducing yield and reliability of semiconductor devices.

Various embodiments in accordance with the present disclosure provide mechanisms of forming a low-k ILD layer high with improved hardness to increase the mechanical strength in a semiconductor structure. Various low-k ILD layers can be fabricated for different interconnect pitches in the BEOL. In some embodiments, for interconnect pitches less than 40 nm, a low-k ILD layer with enhanced hardness (e.g., at least 3 GPa) that is sufficient to overcome dielectric layer bending can be employed. In some embodiments, by adjusting the ILD deposition parameters, e.g., the RF discharge power and/or total gas flow rate, arcing occurred in plasma-enhanced processes can be prevented to avoid damaging the semiconductor device when forming hardened ILD layers. As a result, semiconductor structures can be manufactures with lower RC delay, higher breakdown resistance, and more controllable interconnect line structure in a fabrication process that minimizes dielectric layer arcing.

Figure 1:
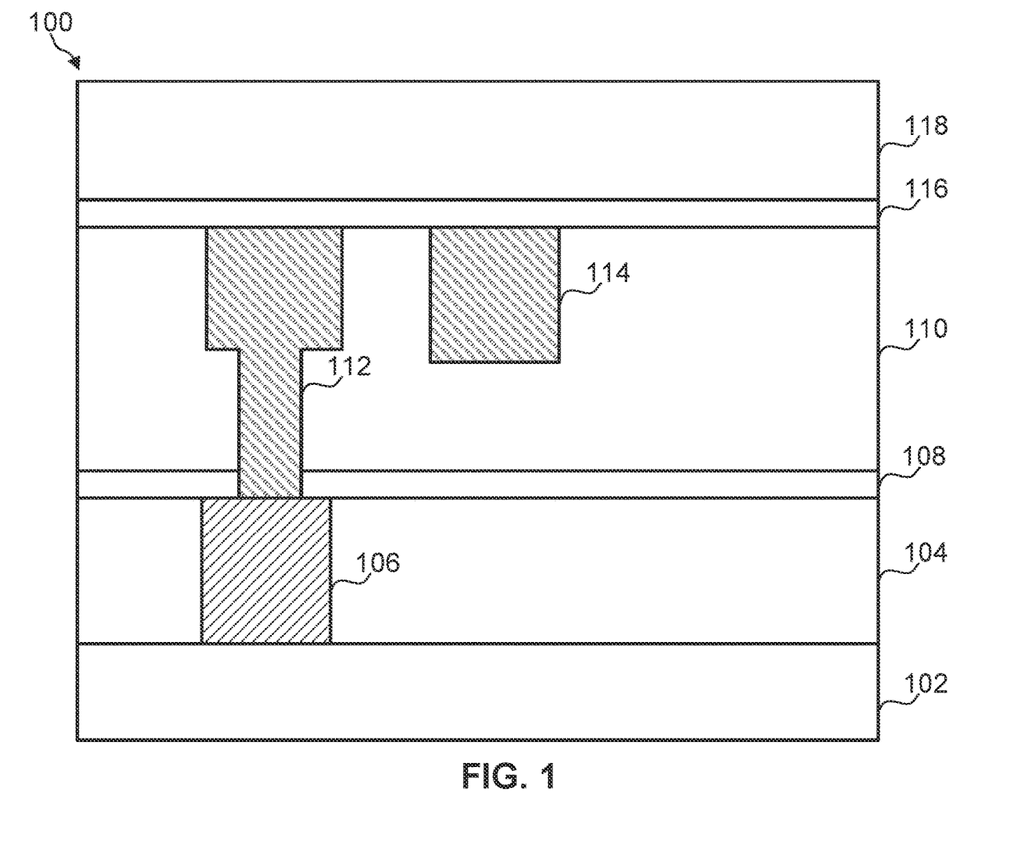
FIG. 1 is a cross-sectional view of an exemplary semiconductor device, in accordance with some embodiments.

FIG. 1 is a cross-sectional view of an exemplary semiconductor device 100, in accordance with some embodiments. Semiconductor device 100 includes a substrate 102, a dielectric layer 104 on substrate 102, and a contact 106 in pre-metal dielectric layer 104. Substrate 102 may be a doped or undoped bulk silicon substrate or a silicon-on-insulator (SOI) substrate. The SOI substrate can include a layer of a semiconductor material such as silicon (Si), germanium (Ge), silicon germanium (SiGe), silicon germanium on insulator (SGOI), or combinations thereof. Other substrates that may be used include multi-layered substrates, gradient substrates, or hybrid orientation substrates.

In some embodiments, as part of the FEOL of semiconductor device 100, active devices (not shown), such as FETs, may be formed in and/or on substrate 102. The active devices may also include capacitors, resistors, inductors, or any other devices that can be used to generate the desired structural and functional requirements of the design for semiconductor device 100. The active devices may be formed using any suitable methods either within or on the surface of substrate 102.

In some embodiments, pre-metal dielectric layer 104 is disposed on substrate 102. Dielectric layer 104 may include a dielectric, such as silicon dioxide, or a dielectric stack, which ensures electrical isolation. As part of the MOL of semiconductor device 100, contact 106 is formed in dielectric layer 104 to electrically connect the active devices in and/or on substrate 102. Contact 106 may include conductive materials, such as tungsten (W). In some embodiments, contact 106 may further include a barrier layer and an adhesion layer (not shown) to prevent diffusion and provide adhesion of the conductive material of contact 106 to dielectric layer 104. The barrier layer may be made of one or more layers of titanium (Ti), titanium nitride (TiN), tantalum (Ta), tantalum nitride (TaN), or any other suitable materials.

In some embodiments, the BEOL of semiconductor device 100 includes a first etch stop layer 108, a first ILD layer 110 on first etch stop layer 108, interconnects 112, 114 in first ILD layer 110, a second etch stop layer 116 on first ILD layer 110, and a second ILD layer 118 on second etch stop layer 116. First etch stop layer 108 may be used to protect substrate 102, dielectric layer 104, and contact 106 from damage caused by further processing and provide a control point for further etching processes. In some embodiments, first etch stop layer 108 may be made of silicon nitride using plasma enhanced chemical vapor deposition (PECVD). Other materials, such as nitride, oxynitride, carbide, boride, combinations thereof, or the like can be used to form first etch stop layer 108 and alternative techniques of forming first etch stop layer 108 can be used such as low pressure CVD (LPCVD), physical vapor deposition (PVD), or the like. First etch stop layer 108 may have a thickness of between about 50 Å and about 2,000 Å, such as about 200 Å.

In some embodiments, first ILD layer 110 is disposed on first etch stop layer 108, and over substrate 102. First ILD layer 110 includes a first dielectric having a dielectric constant of less than about 3.3 and a hardness greater than 3 GPa. In some embodiments, the first dielectric has a dielectric constant of about 3 (e.g., 3) and a hardness of about 5 GPa (e.g., 5 GPa). The dielectric constant of the first dielectric is measured by a mercury probe approach. In some embodiments, the dielectric constant of the first dielectric is between about 2.9 and about 3.3 (e.g., between 2.9 and 3.3). In some embodiments, the dielectric constant of the first dielectric is between about 2.9 and about 3.2 (e.g., between 2.9 and 3.2, between 2.9 and 3.1, between 2.9 and 3.0, between 3.0 and 3.2, between 3.0 and 3.1, or between 3.1 and 3.2). The first dielectric can be a low-k dielectric as it has a dielectric constant less than 3.9. The hardness of the first dielectric can be measured by a nanoindenter approach. In some embodiments, the hardness of the first dielectric is between about 3 GPa and about 7 GPa (e.g., between 3 GPa and 7 GPa, between 4 GPa and 7 GPa, between 5 GPa and 7 GPa, between 6 GPa and 7 GPa, between 3 GPa and 6 GPa, between 4 GPa and 6 GPa, between 5 GPa and 6 GPa, between 3 GPa and 5 GPa, between 4 GPa and 5 GPa, or between 3 GPa and 4 GPa). In some embodiments, the first dielectric is considered as an enhanced hardness dielectric as it has a hardness greater than about 3 GPa.

In some embodiments, the first dielectric of first ILD layer 110 has a refractive index of at least about 1.42 for light having a wavelength of 633 nm. The refractive index of the first dielectric is measured by an ellipsometer approach. In some embodiments, the refractive index of the first dielectric is between about 1.42 and about 1.48 (e.g., between 1.42 and 1.48) for light having a wavelength of 633 nm. In some embodiments, the first dielectric of first ILD layer 110 has a density of at least 1.6 g/cm$^3$. The density of the first dielectric is measured by an X-ray reflectometry approach. In some embodiments, the density of the first dielectric is between about 1.6 g/cm$^3$ and about 1.9 g/cm$^3$ (e.g., between 1.6 g/cm$^3$ and 1.9 g/cm$^3$). The first dielectric of first ILD layer 110 may be made of, for example, fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or the like.

In some embodiments, a plurality of interconnects, including a via 112 and a line 114, are formed in first ILD layer 110. Via 112 may be formed in first ILD layer 110 and first etch stop layer 108 to electrically connect contact 106 in dielectric layer 104 to form a multilayer interconnect structure in semiconductor device 100. Line 114 may be formed in first ILD layer 110. Via 112 and line 114 may include conductive materials, such as copper (Cu). In some embodiments, via 112 and line 114 may further include barrier layers and/or adhesion layers (not shown) to prevent diffusion and provide adhesion of the conductive materials of via 112 and line 114 to the first dielectric of first ILD layer 110. The barrier layer may be made of one or more layers of titanium (Ti), titanium nitride (TiN), tantalum (Ta), tantalum nitride (TaN), or any other suitable materials.

In some embodiments, a pitch of the plurality of interconnects (e.g., via 112 pitch $P_v$ and metal line 114 pitch $P_m$) in the first ILD layer 110 is less than about 40 nm (e.g., less than 40 nm, between 1 nm and 40 nm, between 5 nm and 40 nm, between 10 nm and 40 nm, between 15 nm and 40 nm, between 20 nm and 40 nm, between 25 nm and 40 nm, or between 30 nm and 40 nm). In some embodiments, the pitch of the plurality of interconnects in first ILD layer 110 is between about 28 nm and about 39 nm (e.g., between 28 nm and 39 nm). In some embodiments, the pitch of the plurality of interconnects in first ILD layer 110 is about 28 nm (e.g., 28 nm), about 20 nm (e.g., 20 nm), about 16 nm (e.g., 16 nm), about 12 nm (e.g., 12 nm), about 10 nm (e.g., 10 nm), about 7 nm (e.g., 7 nm), about 5 nm (e.g., 5 nm), or about 3 nm (e.g., 3 nm). It is to be appreciated that the occurrence of dielectric layer bending may relate to the interconnect pitch since smaller interconnect pitches may require a higher dielectric hardness to support the interconnect openings prior to gap-fill. Thus, the hardness (and the dielectric constant in some embodiments) of the first dielectric of first ILD layer 110 may vary depending on the pitch of the interconnects in first ILD layer 110. In some embodiments, the first dielectric having a hardness of at least about 3 GPa can reduce dielectric layer bending for interconnects having a pitch of about 40 nm. In some embodiments, when the pitch of the interconnects in first ILD layer 110 is between 28 nm and 39 nm, the spacing of the first dielectric in first ILD layer 110 is between 14 nm and 20 nm, and the aspect ratio of the first dielectric in first ILD layer 110 is 3.8. Further, in some embodiments, the dielectric constant of the first dielectric is between 2.9 and 3.2, and the hardness of the first dielectric is between 3 GPa and 7 GPa.

In some embodiments, second etch stop layer 116 is formed on first ILD layer 110 to protect first ILD layer 110 and via 112 and line 114 from damage caused by further processing and provide for a control point for further etching processes. In some embodiments, second etch stop layer 116 may be made of silicon nitride, oxynitride, carbide, boride, combinations thereof, or the like. Second etch stop layer 116 may have a thickness of between about 50 Å and about 2,000 Å, such as about 200 Å.

In some embodiments, second ILD layer 118 is disposed on second etch stop layer 116. Similar to first ILD layer 110, second ILD layer 118 may include an enhanced hardness, low-k dielectric as described herein with respect to the first dielectric. The material properties of second dielectric in second ILD layer 118 may be nominally the same as the material properties of first dielectric in first ILD layer 110, according to some embodiments. For example, the dielectric constant and hardness of the first and second dielectrics in first and second ILD layers 110 and 118, respectively, may be nominally the same.

In some embodiments, the material properties of second dielectric in second ILD layer 118 may be different than the material properties of first dielectric in first ILD layer 110, according to some embodiments For example, the pitches of the interconnects in first and second ILD layers 110 and 118 can be different since first and second ILD layers 110 and 118 are in different vertical levels of semiconductor device 100. The pitch of the interconnects (not shown) in second ILD layer 118 can be larger than the pitch of the interconnects in first ILD layer 110. Thus, the hardness of the second dielectric in second ILD layers 118 may be smaller than the hardness of the first dielectric in first ILD layer 110. In another example, the dielectric constants of the first and second dielectrics in first and second ILD layers 110 and 118 may be different, and/or the hardnesses of the first and second dielectrics in first and second ILD layers 110, 118 may be different.

Figure 2A:
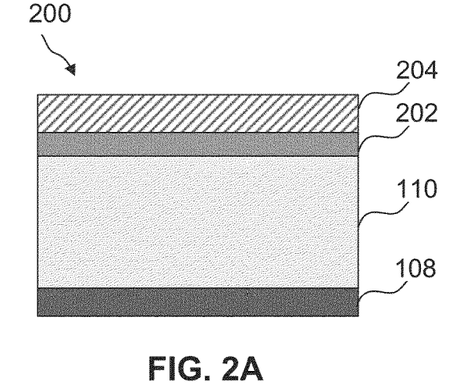
FIGS. 2A-2F are cross-sectional views of a partially-fabricated exemplary semiconductor device, in accordance with some embodiments.

FIGS. 2A-2F are cross-sectional views of a partially-fabricated exemplary semiconductor device 200, in accordance with some embodiments. In FIG. 2A, a partially-fabricated semiconductor device 200 includes first etch stop layer 108 and first ILD layer 110 over a substrate (not shown). A photolithography operation and a series of etching operations can be performed to form openings for interconnects in first etch stop layer 108 and first ILD layer 110. An HM layer 202 is deposited on first ILD layer 110, followed by photoresist 204 coated on HM layer 202. HM layer 202 may include a metal film, such as but not limited to, chrome (Cr) or titanium nitride (TiN).

As described herein with respect to FIG. 1, first ILD layer 110 includes the first dielectric having a dielectric constant of at most about 3.3 and a hardness of at least about 3 GPa, according to some embodiments. The first dielectric may be formed by a film deposition process, such as a CVD process, using precursor and oxygen ($O_2$) gas. The precursor includes, for example, tetra-ethyl-ortho-silicate (TEOS), methyldiethoxy silane (DEMS), silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), or any combination thereof. In some embodiments, CxHy is incorporated within precursor (e.g., TEOS), or CxHy is added by separate precursor (e.g., $C_3H_8$ or atom-transfer radical-polymerization (ATRP)) during the CVD process. In one example, the precursor includes trimethylsilane (3MS)/tetramethysilane (4MS) (Si—(CxHy)z; x=1~10, y=2~30, z=1~4 or O embedded). In another example, the precursor includes Si—O embedded TEOS/mDEOS. In still another example, the precursor includes Si—C—Si embedded bis(triethoxysilyl)ethane (BTSE). In some embodiments, porogen is not used in the CVD process. In some embodiments, a PECVD process is used to deposit the first dielectric to increase the deposition rate of the CVD process. It is to be appreciated that the film deposition process for forming the first dielectric can be any other suitable process such as, for example, atomic layer deposition (ALD), plasma-enhanced ALD (PEALD), electron beam assisted deposition, molecular beam epitaxy (MBE), high density plasma CVD (HDPCVD), metal organic CVD (MOCVD), remote plasma CVD (RPCVD), plating, and/or combinations thereof.

In some embodiments, the first dielectric of first ILD layer 110 is deposited using PECVD. The temperature in the PECVD chamber during deposition may be between about 100° C. and about 500° C. (e.g., between 100° C. and 500° C.). To control the hardness of the first dielectric to be at least 3, in the PECVD chamber, the ratio (flow ratio) of the first flow rate of the precursor and the second flow rate of the oxygen gas is at least about 25 (e.g., 25). In some embodiments, the flow ratio is between about 25 and about 100 (e.g., between 25 and 100, 35 and 100, 45 and 100, 55 and 100, 65 and 100, 75 and 100, 85 and 100, 95 and 100, 25 and 90, 35 and 90, 45 and 90, 55 and 90, 65 and 90, 75 and 90, 85 and 90, 25 and 80, 35 and 80, 45 and 80, 55 and 80, 65 and 80, 75 and 80, 25 and 70, 35 and 70, 45 and 70, 55 and 70, 65 and 70, 25 and 60, 35 and 60, 45 and 60, 55 and 60, 25 and 50, 35 and 50, 45 and 50, 25 and 40, 35 and 40, or 25 and 30). In some embodiments, the gas ratio is about 50 (e.g., 50).

In some embodiments, increasing the flow ratio (e.g., above 25) may increase the occurrence of arcing occurred during the PECVD process. In some embodiments, to decrease the occurrence of arcing in depositing the first dielectric of first ILD layer 110, the power of the RF discharge is at most about 600 W. In some embodiments, the RF discharge power is between about 200 W and about 600 W (e.g., between 200 W and 600 W, 300 W and 600 W, 400 W and 600 W, 500 W and 600 W, 200 W and 500 W, 300 W and 500 W, 400 W and 500 W, 200 W and 400 W, 300 W and 400 W, or 200 W and 300 W). In some embodiments, to decrease the occurrence of arcing in depositing the first dielectric of first ILD layer 110, the total flow rate of the first flow rate of the precursor and the second flow rate of the oxygen gas is at most about 5000 sccm. In some embodiments, the total flow rate is between about 1500 sccm and about 5000 sccm (e.g., between 1500 sccm and 5000 sccm, 2500 sccm and 5000 sccm, 3500 sccm and 5000 sccm, 4500 sccm and 5000 sccm, 1500 sccm and 4000 sccm, 2500 sccm and 4000 sccm, 3500 sccm and 4000 sccm, 1500 sccm and 3000 sccm, 2500 sccm and 3000 sccm, or 1500 sccm and 2000 sccm).

In some embodiments, ultraviolet (UV) curing is performed with UV wavelength at 150 nm to 400 nm, with a pressure of 1 Torr to 50 Torr, with a temperature of 100° C. to 500° C., and with an environment of helium (He), argon (Ar), nitrogen ($N_2$), and/or hydrogen ($H_2$) gases. In some embodiments, after depositing the first dielectric, a thermal treatment and a plasma treatment are also performed at a temperature between 100° C. and 500° C. and in an environment of helium (He), argon (Ar), nitrogen ($N_2$), hydrogen ($H_2$), carbon monoxide (CO), carbon dioxide ($CO_2$), and/or nitrous oxide ($N_2O$) gases. In some embodiments, after depositing the first dielectric, an electron beam treatment is performed at a temperature of 100° C. to 500° C., with a pressure of 0.01 mTorr to 100 mTorr, and in an environment of helium (He), argon (Ar), nitrogen ($N_2$), hydrogen ($H_2$), carbon monoxide (CO), carbon dioxide ($CO_2$), and/or nitrous oxide ($N_2O$) gases.

Figure 2B:
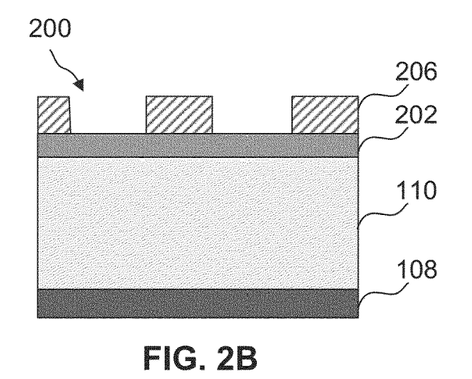

In FIG. 2B, photoresist 204 is photo-exposed and patterned over HM layer 202 to form a patterned photoresist 206. Patterned photoresist 206 can be used to expose areas of partially-fabricated semiconductor device 200 where interconnects will be formed and to protect other areas where interconnects should not be formed. The photolithography mask for making patterned photoresist 206 may have a pitch that is nominally the same as the pitch of the interconnects to be formed in first ILD layer 110 of partially-fabricated semiconductor device 200. That is, in some embodiments, the pitch of the interconnects to be formed in first ILD layer 110 of partially-fabricated semiconductor device 200 may be defined by the pitch of patterned photoresist 206.

Figure 2C:
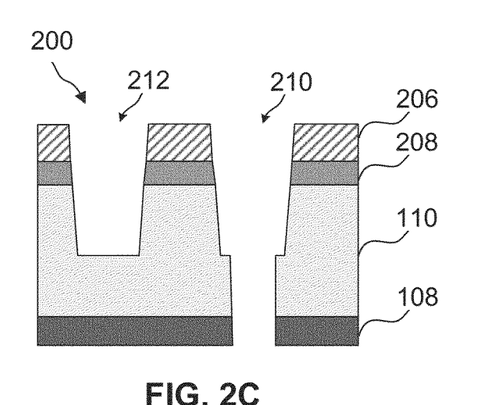

In FIG. 2C, HM layer 202 is etched using patterned photoresist 206 as the mask to form a patterned HM layer 208. The exposed areas of HM layer 202 that are not covered by patterned photoresist 206 are removed by a wet etching or a dry etching process, leaving the areas of HM layer 202 that are covered by patterned photoresist 206 remain in patterned HM layer 208. The etching processes can be performed using dry etching processes, such as reactive ion etch (RIE) or other suitable processes. In some embodiments, the etching processes can be formed using wet chemical etching process.

Another etching process using patterned HM layer 208 as the mask removes exposed areas of first ILD layer 110 and first etch stop layer 108 to form a via hole 210 that stops on underlying contact (not shown). The etching process also removes the exposed areas of first ILD layer 110 to form a trench 212 that stops in first ILD layer 110. In some embodiments, the etching process has high selectivity for first ILD layer 110 and first etch stop layer 108. In some embodiments, the etching process automatically stops after a predetermined amount of time, for example, for forming trench 212. An etching process which is terminated after a predetermined amount of time is referred to as a "timed etch." An "end-pointed" etching process is a process that automatically stops when the layer directly underneath the etched layer is detected, for example, for forming via hole 210. End-point detection is possible because first etch stop layer 108 and the underlying layer contact are made of different materials. Consequently, first etch stop layer 108 and the underlying layer can have different etch rates for a given etching chemical substance. Since the etching process can be used to etch different materials (e.g., first ILD layer 110 and first etch stop layer 108), different etching chemical substances may be required. An exemplary etching chemical substance can include a combination of hydrobromic acid (HBr), helium (He), oxygen ($O_2$) and chlorine ($Cl_2$). In addition to the etching chemical substance, other etching process parameters can be adjusted, such as flow rate, temperature, and pressure. These parameters can be used to control the etch rate, etch profile, uniformity, etc.

Figure 2D:
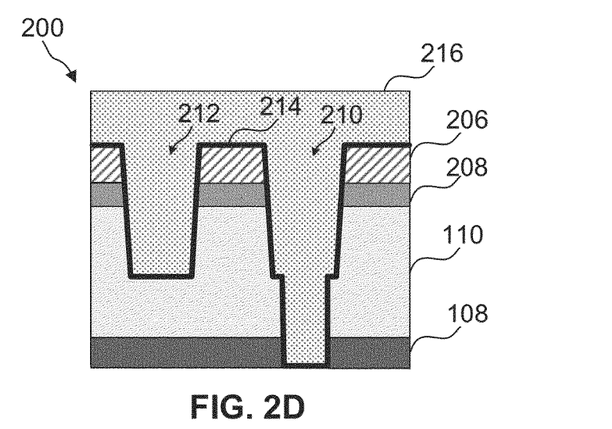

In FIG. 2D, a gap-fill process is performed to fill via hole 210 and trench 212 with conductive material 216. Prior to a deposition of conductive material 216, a barrier layer 214 is first deposited to cover the field regions of partially-fabricated semiconductor device 200, the sidewalls of via hole 210 and trench 212, and the bottom surface of trench 212. Barrier layer 214 may be made of one or more layers of titanium (Ti), titanium nitride (TiN), tantalum (Ta), tantalum nitride (TaN), or any other suitable materials by CVD and/or PVD. Conductive material 216, such as copper (Cu), cobalt (Co), aluminum (Al), graphene, or any other suitable conductive material, may be deposited over barrier layer 214. Conductive material 216 may be deposited by CVD, PVD, an electroplating process, an electroless process, or any other suitable deposition process. Depending on the material of conductive material 216, a seed layer (now shown) may be deposited over barrier layer 214 prior to the deposition of conductive material 216.

Figure 2E:
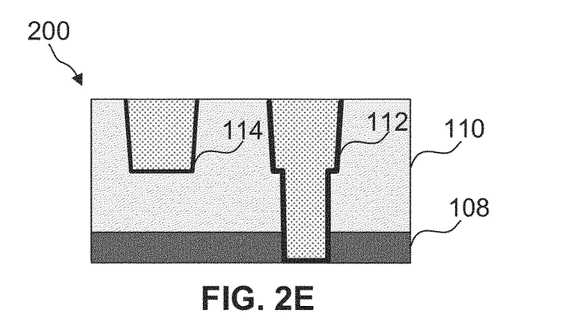

In FIG. 2E, conductive material 216 is removed to a depth that reaches or approximately reaches the top surface of first ILD layer 110. Patterned photoresist 206 and patterned HM layer 208 may be removed to expose first ILD layer 110. In some embodiments, patterned photoresist 206 and/or patterned HM layer 208 may be removed prior to the formation of barrier layer 214. Conductive material 216, patterned photoresist 206, and patterned HM layer 208 can be removed by chemical mechanical polishing (CMP), dry etching, wet etching, or any other suitable removal technique.

Figure 2F:
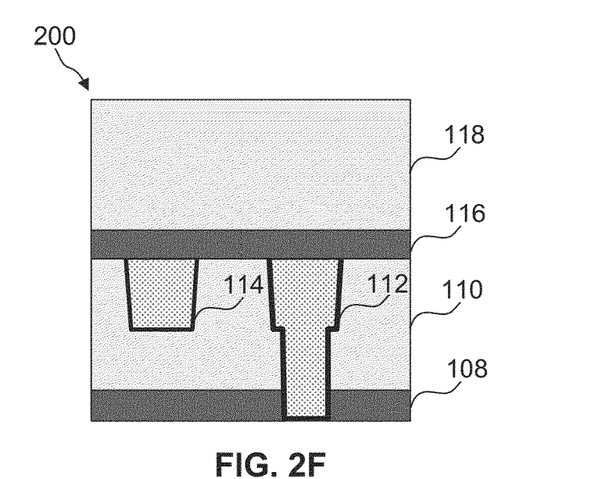

In FIG. 2F, second etch stop layer 116 is deposited on first ILD layer 110, and second ILD layer 118 is deposited on second etch stop layer 116 and formed over first ILD layer 110. The process of forming second etch stop layer 116 may be nominally the same as the process of forming first etch stop layer 108. Second ILD layer 118 includes the second dielectric. In some embodiments, the process of forming second ILD layer 118 may be nominally the same as the process of forming first ILD layer 110 such that the material properties (e.g., dielectric constant and hardness) of the second dielectric of second ILD layer 118 are nominally the same as those of the first dielectric of first ILD layer 110 as described herein in detail.

In some embodiments, depending on the pitch, $P_{int}$, of the interconnects to be formed in second ILD layer 118, the process of forming second ILD layer 118 may be different than the process of forming first ILD layer 110 such that the material properties (e.g., dielectric constant and hardness) of the second dielectric of second ILD layer 118 are different from those of the first dielectric of first ILD layer 110. For example, the second dielectric may be different than the first dielectric and have a dielectric constant of at most about 3.3 and a hardness of at least about 3 GPa. In some embodiments, the hardness of the second dielectric of second ILD layer 118 is less than the hardness of the first dielectric of first ILD layer 110. In some embodiments, the second dielectric of second ILD layer 118 may have a hardness less than 3 GPa (which may not be an enhanced hardness dielectric according to embodiments of the present disclosure).

Figure 3:
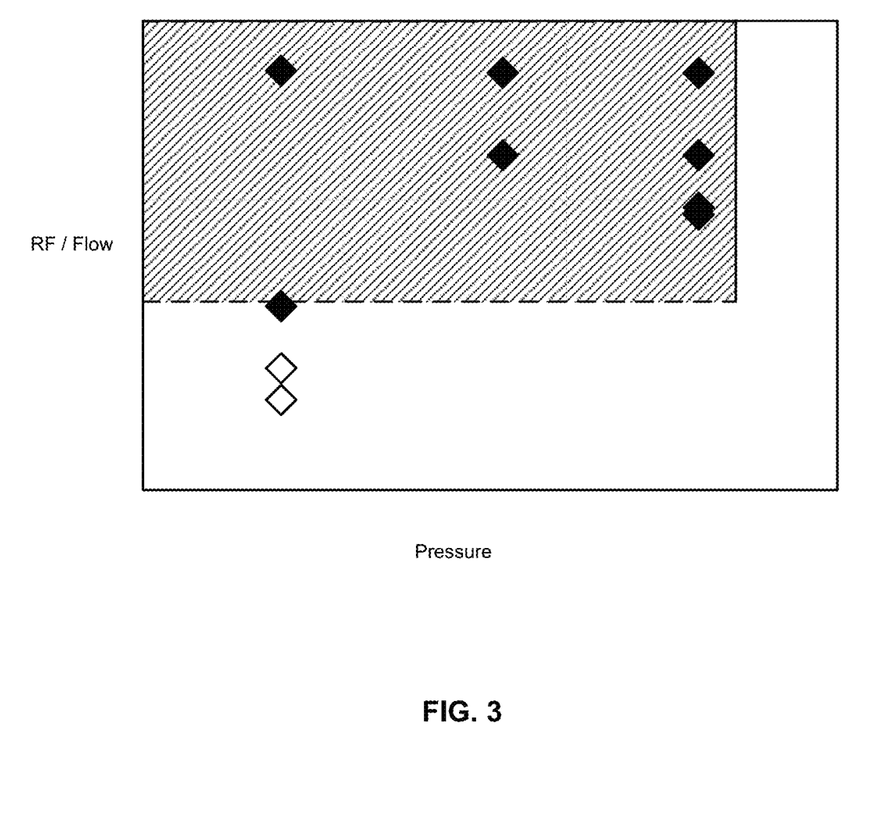
FIG. 3 illustrates exemplary occurrences of arcing in relation to pressure and a ratio of radio frequency (RF) discharge power to flow rate in a chamber, in accordance with some embodiments.

FIG. 3 illustrates exemplary occurrences of arcing in relation to the pressure and the ratio of RF discharge power and flow rate in the chamber, in accordance with some embodiments. In FIG. 3, each solid dot represents one deposition event in which arcing occurs, and each open dot represents one deposition event in which no arcing occurs. A "arcing zone" can be seen in FIG. 3 (represented as the hashed region), while the remaining region is a "non-arcing zone." In some embodiments, increasing the deposition pressure and/or decreasing the ratio of RF discharge power and flow rate may move the deposition events out from the arcing zone in FIG. 3.

Figure 4:
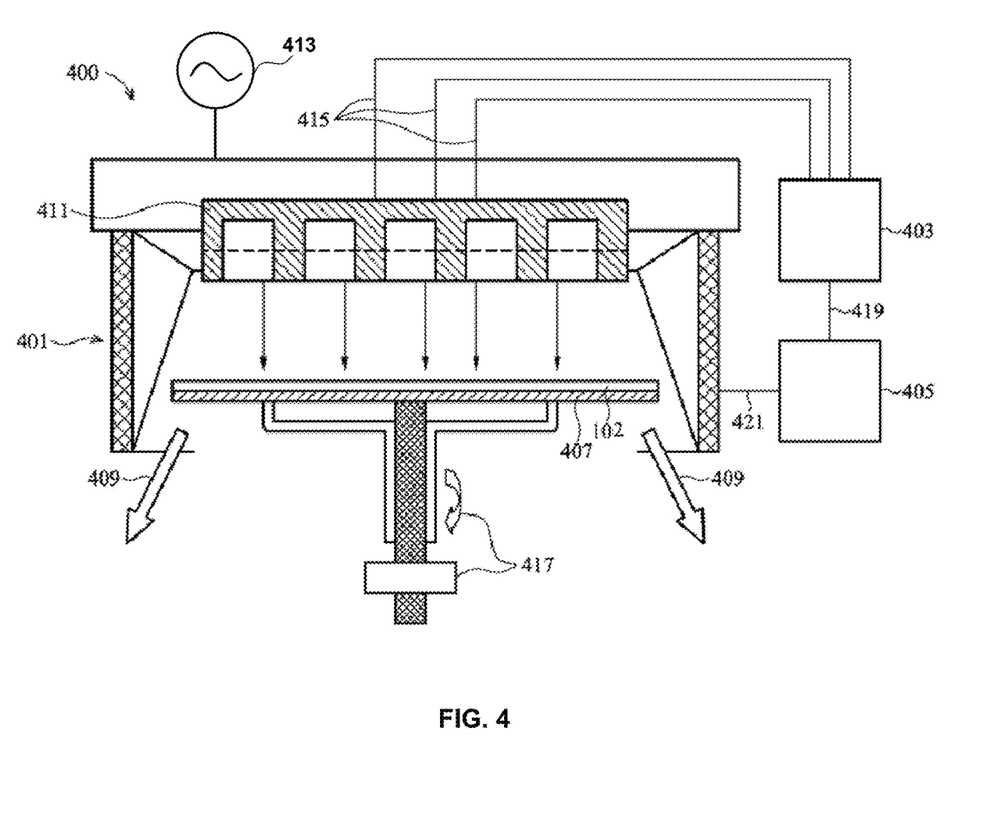
FIG. 4 is a cross-sectional view of an exemplary apparatus for forming an interlayer dielectric (ILD) layer, in accordance with some embodiments.

FIG. 4 is a cross-sectional view of an exemplary apparatus 400 for forming an ILD layer, in accordance with some embodiments. Apparatus 400 may be used to deposit an enhanced hardness low-k dielectric in an ILD layer, such as first ILD layer 110 and second ILD layer 118 as described herein. Apparatus 400 may be a CVD machine (e.g., a PECVD machine), an ALD machine (e.g., a PEALD machine), an electron beam assisted deposition machine, or any other suitable machine for film deposition. Apparatus 400 may include a chamber 401, a gas input area 403, and a controller 405. Chamber 401 may be capable of maintaining a vacuum, holding substrate 102 (and its overlying layers such as dielectric layer 104 and first etch stop layer 108) on a platen 407, and exhausting gases through exhaust ports 409. Further, a showerhead 411 is disposed within chamber 401. Showerhead 411 may be connected to gas input area 403, which feeds gas into showerhead 411. Showerhead 411 may receive multiple gases simultaneously from gas input area 403 through gas pipes 415. Mechanisms 417 may be in place to structurally support, heat, and rotate substrate 102. In some embodiments, chamber 401 may be configured to hold multiple work pieces.

Gas input area 403 may be internal to apparatus 400, such as bottles of source gas (e.g., precursors and oxygen gas as described herein), alternate gas sources, a valve system connected to an external gas distribution area, or the like. Alternately, gas input area 403 may be external to apparatus 400. Multiple gases may be received by showerhead 411, which delivers the gases to chamber 401.

Controller 405 may be any appropriate microprocessor unit, including a computer internal or external to apparatus 400. Controller 405 may control the gas flow into showerhead 411 through a connection 419. Further, controller 405 may control the temperature, the rotation of substrate 102, the vacuum and/or pumping of chamber 401, and the like, through a connection 421.

In some embodiments, apparatus 400 is a PECVD machine, a PEALD machine, or any plasma-enhanced deposition machine. Apparatus 400 can include an RF source 413 for generating plasma in chamber 401 during the deposition. Controller 405 may further control the power of RF discharge generated by RF source 413 during the deposition.

In some embodiments, controller 405 controls gas input area 403 to introduce the precursor and the oxygen gas (e.g., at the same time) to chamber 401. For example, the precursor may be introduced at a rate of between about 1440 sccm and about 4950 sccm, such as about 2942 sccm, while the oxygen gas may be introduced at a rate of between about 50 sccm and about 60 sccm, such as about 58 sccm. In some embodiments, controller 405 controls gas input area 403 so that the total flow rate of the precursor and the oxygen gas is between 1500 sccm and 5000 sccm, such as 3000 sccm, and the flow ratio of the precursor and the oxygen gas is between 25 and 100, such as 50. In some embodiments, controller 405 controls RF source 413 to generate plasma at the RF discharge power of between 200 W and 600 W, such as 400 W.

Figure 5:
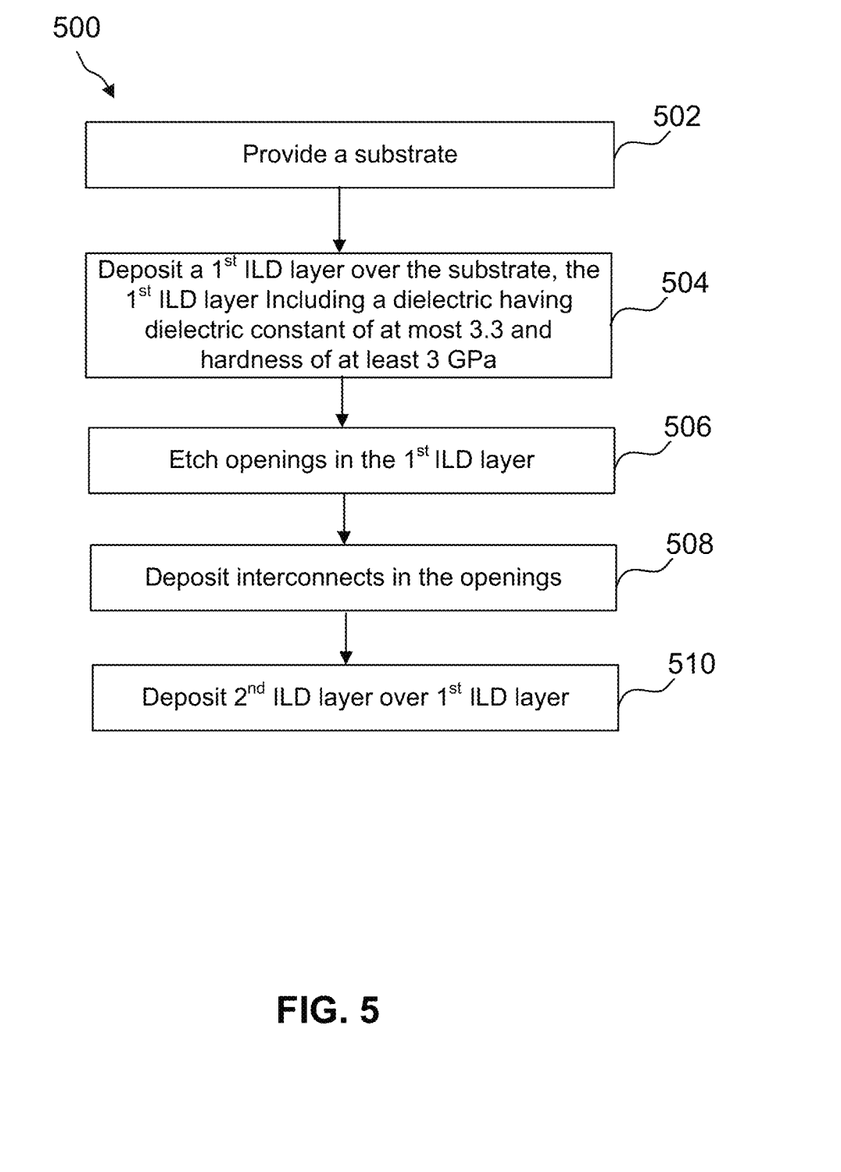
FIG. 5 is a flow diagram of an exemplary method for forming a semiconductor device, in accordance with some embodiments.

FIG. 5 is a flow diagram of an exemplary method 500 of forming a semiconductor device, in accordance with some embodiments. Other operations may be performed between the various operations of method 500, and are omitted merely for clarity. The fabrication process of a semiconductor device having an ILD layer including an enhanced hardness low-k dielectric is not limited to the exemplary method 500.

Method 500 starts with operation 502, where a substrate is provided. The substrate may be a doped or undoped bulk silicon substrate or a SOI substrate. For example, as shown in FIG. 1, FEOL and MOL structures, such as the active devices, dielectric layer 104, and contact 106 may be formed over substrate 102. First etch stop layer 108 may be formed over substrate 102 as well.

Method 500 continues with operation 504, where a first ILD layer is deposited over the substrate. The first ILD layer may include a dielectric made of carbon-doped silicon dioxide. The dielectric constant of the dielectric is at most about 3.3, and the hardness of the dielectric is at least about 3 GPa, according to some embodiments. In some embodiments, the dielectric constant of the dielectric is between about 2.9 and about 3.2, such as about 3. In some embodiments, the hardness of the dielectric is between about 3 GPa and about 7 GPa, such as about 5 GPa. In some embodiments, the refractive index of the dielectric is at least about 1.42 for light having a wavelength of 633 nm, such as between about 1.42 and about 1.48. In some embodiments, the density of the dielectric is at least about 1.6 g/cm$^3$, such as about 1.6 g/cm$^3$ and about 1.9 g/cm$^3$. For example, the first ILD layer may be first ILD layer 110 or second ILD layer 118 in FIG. 1.

In some embodiments, operation 504 may include two operations for depositing the first ILD layer. First, a precursor and oxygen gas are introduced to a deposition chamber (e.g., chamber 401). A ratio between the first flow rate of the precursor and the second flow rate of the oxygen gas is at least about 25, and a total flow rate of the first and second flow rates is at most about 5000 sccm. In some embodiments, the ratio is between about 25 and about 100, and the total flow rate is between about 1500 sccm and about 5000 sccm. The temperature in the chamber is between about 100° C. and about 500° C. For example, as shown in FIG. 4, controller 405 controls gas input area 403 to introduce the precursor and the oxygen gas at the same time to chamber 401. Controller 405 may also control the flow ratio and total flow rate as described herein.

Second, an RF discharge having a power of at most 600 W is provided. In some embodiments, the power of the RF discharge is between about 200 W and about 600 W. For example, as shown in FIG. 4, controller 405 controls RF source 413 to provide RF discharge at the power as described herein to generate plasma in chamber 401 during the deposition of the enhanced hardness low-k dielectric of the first ILD layer. By controlling the total flow rate and/or the RF discharge power as described herein, the chance of arcing occurred during operations in method 600 can be reduced or eliminated.

Method 500 continues with operation 506, where opening are etched in the first ILD layer. Openings may include via openings and trenches and may be etched through the entire thickness of the first ILD layer or some of the entire thickness of the first ILD layer.

Method 500 continues with operation 508, where interconnects are deposited in the openings. The pitch of the interconnects may be at most about 40 nm. In some embodiments, the pitch of the interconnects is between about 28 nm and about 39 nm, such as about 28 nm. For example, the interconnects may include via 112 and line 114 in FIG. 1.

Method 500 continues with operation 510 where a second ILD layer is deposited over the first ILD layer. In some embodiments, the second ILD layer includes a second dielectric having a dielectric constant different from the dielectric constant of the first dielectric of the first ILD layer and a hardness different from the hardness of the first dielectric of the first ILD layer. In some embodiments, the second ILD layer includes a second dielectric having a dielectric constant nominally the same as the dielectric constant of the first dielectric of the first ILD layer and a hardness nominally the same as the hardness of the first dielectric of the first ILD layer.

According to some embodiments, an enhanced hardness low-k dielectric in ILD layers as disclosed in the present disclosure can reduce or eliminate dielectric layer bending in the openings. Via bending is one example of dielectric layer bending in openings, which is the bending of sidewalls of an opening (e.g., a trench) in the ILD layer induced by the via underneath. Via bending can cause the critical dimension (CD) of an interconnect formed in the trench to change, which can be quantified by After Barrier Seed Deposition Inspection (ABSI) CD bias. In some embodiments, an enhanced hardness low-k dielectric in ILD layers as disclosed herein can cause the ABSI CD bias of interconnects formed in the ILD layers to be less than about 3 nm, such as less than 0.1 nm, less than 0.2 nm, less than 0.3 nm, less than 0.4 nm, less than 0.5 nm, less than 0.6 nm, less than 0.7 nm, less than 0.8 nm, less than 0.9 nm, less than 1 nm, less than 1.5 nm, less than 2 nm, less than 2.5 nm, less than 3 nm, any range bounded on the lower end by any of these values, or within any range defined by any two of these values.

Various embodiments in accordance with the present disclosure provide mechanisms of forming an enhanced hardness low-k dielectric in ILD layers to increase the mechanical strength in a semiconductor structure. In some embodiments, an ILD layer having an enhanced hardness low-k dielectric is formed. The hardness of the low-k dielectric is sufficient to overcome the dielectric layer bending of the openings (e.g., trenches and via holes) of the interconnects (e.g., lines and vias) formed in the ILD layer. In some embodiments, the low-k ILD layers with enhanced hardness may be formed by a high-carbon deposition process. For example, the ratio between the flow rate of the precursor and the flow rate of the oxygen gas introduced into the deposition chamber may be at least about 25. In some embodiments, by adjusting the ILD deposition parameters, e.g., the RF discharge power and total flow rate, arcing occurred in some plasma enhanced processes can be prevented to avoid damaging the semiconductor devices during the high-carbon deposition process.

In some embodiments, a semiconductor device includes a substrate and a ILD layer over the substrate. The ILD layer includes a dielectric with a dielectric constant of less than about 3.3 and a hardness of at least about 3 GPa. The semiconductor device also includes an interconnect formed in the ILD layer.

In some embodiments, a method of forming a semiconductor device includes providing a substrate and depositing an ILD layer over the substrate. The ILD layer includes a dielectric with a dielectric constant of less than about 3.3 and a hardness of at least about 3 GPa. The method further includes etching an opening in the ILD layer and depositing an interconnect in the opening.

In some embodiments, a method of forming a semiconductor device includes providing a substrate and depositing an ILD layer over the substrate. Forming the ILD layer includes introducing a precursor at a first flow rate and an oxygen gas at a second flow rate to the chamber. A ratio between the first flow rate and the second flow rate is at least about 25. A total flow rate of the first and second flow rates is at most about 5000 sccm. Forming the ILD layer further includes providing an RF discharge having a power of at most about 600 W in the chamber. The method further includes etching an opening in first ILD layer and depositing an interconnect in the opening.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a semiconductor device, the method comprising:
   depositing a first interlayer dielectric (ILD) layer on a substrate, wherein the first ILD layer comprises a dielectric constant of less than about 3.3 and a hardness of at least about 3.2 GPa;
   performing, on the first ILD layer, a curing process under an ultra-violet (UV) radiation, a thermal treatment process, and a plasma treatment process;
   forming a patterned metal layer with a plurality of openings on the first ILD layer;
   etching the first ILD layer through the plurality of openings in the patterned metal layer to form first and second trenches in the first ILD layer;
   forming a via and a first metal line in the first trench;
   forming a second metal line in the second trench; and
   forming a second ILD layer on the first ILD layer, wherein the second ILD layer comprises a hardness different from that of the first ILD layer.

2. The method of claim 1, wherein the hardness of the first ILD layer is from about 3.2 GPa to about 7 GPa.

3. The method of claim 1, wherein the hardness of the second ILD layer is less than 3 GPa.

4. The method of claim 1, wherein forming the via and the first metal line comprises depositing a conductive material in the first trench.

5. The method of claim 1, wherein depositing the first ILD layer comprises depositing a carbon-doped material.

6. The method of claim 1, wherein forming the patterned metal layer comprises:
   depositing a metal layer on the first ILD layer; and
   etching the metal layer to form the plurality of openings in the metal layer.

7. The method of claim 1, wherein forming the patterned metal layer comprises depositing a layer of chrome on the first ILD layer.

8. The method of claim 1, further comprising performing an electron beam treatment on the first ILD prior to forming the patterned metal layer.

9. The method of claim 1, wherein performing the thermal treatment process comprises annealing the first ILD layer with a gas ambient, wherein the gas ambient comprises carbon monoxide or carbon dioxide.

10. A method of forming a semiconductor device, the method comprising:
    depositing, on a substrate, a first interlayer dielectric (ILD) layer with a dielectric having a hardness of at least about 3.2 GPa, wherein depositing the first ILD layer comprises:
      depositing the first ILD layer in a porogen-free deposition process; and
      introducing a precursor at a first flow rate and an oxygen gas at a second flow rate into a chamber, wherein a ratio between the first flow rate and the second flow rate is at least about 25, and a total flow rate of the first and second flow rates is less than about 5000 sccm;
    performing, on the first ILD layer, a thermal treatment process and a plasma treatment process;
    forming vias and metal lines in the first ILD layer after performing the thermal treatment process and the plasma treatment process; and
    forming a second ILD layer on the first ILD layer, the second ILD layer having a different hardness than that of the first ILD layer.

11. The method of claim 10, wherein the ratio is between about 25 and about 100.

12. The method of claim 10, wherein the total flow rate is between about 1500 sccm and about 5000 sccm.

13. The method of claim 10, wherein depositing the first ILD layer further comprises providing, in the chamber, a radio frequency (RF) discharge having a power between about 200 W and about 600 W.

14. The method of claim 10, wherein performing the thermal treatment process comprises annealing the first ILD layer with a gas ambient, wherein the gas ambient comprises carbon monoxide or carbon dioxide.

15. The method of claim 10, wherein forming the vias comprises etching through the etch stop layer, and
    wherein forming the metal lines comprises forming a trench having a bottom surface over the etch stop layer.

16. The method of claim 10, wherein depositing the first ILD layer comprises depositing a carbon-doped material.

17. A method for forming a semiconductor device, the method comprising:
    forming, on a substrate, a first interlayer dielectric (ILD) layer having a hardness greater than about 3 GPa, wherein forming the first ILD layer comprises depositing a dielectric layer in a porogen-free deposition process;
    performing, on the first ILD layer, a curing process under an ultra-violet (UV) radiation;
    forming an interconnect in the first ILD layer after performing the curing process; and
    forming a second ILD layer on the interconnect.

18. The method of claim 17, wherein forming the first ILD layer comprises supplying a hydrocarbon-containing gas at a first flow rate and an oxygen gas at a second flow rate, wherein a ratio of the first flow rate to the second flow rate is greater than about 25.

19. The method of claim 17, wherein forming the first ILD layer comprises depositing the first ILD layer in a substantially arc-free deposition process.

20. The method of claim 17, wherein forming the interconnect comprises:
    depositing a metal layer on the first ILD layer;
    etching the metal layer to form an opening in the metal layer;

etching the first ILD layer through the opening to form a trench in the first ILD layer; and
depositing a conductive material in the trench.

* * * * *